United States Patent
Kao et al.

(10) Patent No.: US 6,602,777 B1
(45) Date of Patent: Aug. 5, 2003

(54) METHOD FOR CONTROLLING THE FORMATION OF INTERMETALLIC COMPOUNDS IN SOLDER JOINTS

(75) Inventors: Cheng-Heng Kao, Tao-Yuang (TW); Cheng-En Ho, Taipei (TW)

(73) Assignee: National Central University, Taoyuan Hsien (TW)

(*) Notice: Subject to any disclaimer, the term of this patent is extended or adjusted under 35 U.S.C. 154(b) by 0 days.

(21) Appl. No.: 10/104,085

(22) Filed: Mar. 20, 2002

(30) Foreign Application Priority Data

Dec. 28, 2001 (TW) ........................................ 90132742 A

(51) Int. Cl.⁷ .............................................. H01L 21/44
(52) U.S. Cl. .................. 438/613; 438/119; 228/180.22; 228/262.3; 228/262.31; 430/557; 430/560; 428/646; 428/647; 428/648
(58) Field of Search ................................. 438/119, 613; 228/180.22, 262.3, 262.31; 420/557, 560; 428/646, 647, 648

(56) References Cited

PUBLICATIONS

Zheng et al., Intermetallic Growth on PWBs Soldered with Sn3.8Ag.07Cu, 2002 Electronic Components & Technology Conference, Apr. 2002, pp. 1226–1231.*

Zeng et al., Intermetallic Reactions between Lead–free SnAgCu Solder and Ni(P)/Au Surface Finish on PWBs, 2001 Electronic Components & Technology Conference, Apr. 2001.*

Yang et al., Intermetallic Growth between SN–Ag–(Cu) Solder and Ni, 2001 Int'l Symposium on Electronic Materials and Packaging, Jul., 2001, pp. 219–224.*

Zeng et al., Interfacial Reactions between Lead–free SnAgCu Solder and Ni(P) Surface Finish aon Printed Circuit boards, IEEE Transactions on Electronic packaging Manufacturing, vol., 25, No. 3, Jul. 2002, pp. 162, 167.*

Kinyanjui et al., Effects of Reflow Conditions on the Formation of Au–Ni–Sn Compounds at the INterface of Au–Pb–Sn and Au–Sn Solder Joints with Ni Substrate, 2002 Electronic Components & Technology Conference, Apr. 2002, pp. 161–167.*

Shiau et al., Effectg of Cu Concentrastin on teh Solid–State Aging Reactions bewtween SnAgCu Lead–free Solders and Ni, From Http://www.seas.ucla.edu/eThinFilm/Pb–free–Workshop/abs/p_shiau.html website, found 3/3/3.*

Shiau et al., Reactions between Sn–Ag–Cu Lead–freee Solders and the Au/Ni Surface Finish in Advanced Electronic Packages, found on INSPEC search engine, 2002.*

* cited by examiner

Primary Examiner—David L. Talbott
Assistant Examiner—David A. Zarneke
(74) Attorney, Agent, or Firm—J. C. Patents

(57) ABSTRACT

The present invention relates to a method for controlling the formation of the intermetallic compounds in solder joints, The types of the intermetallic compounds between the SnAgCu solders and the Ni-bearing substrate can be controlled by adjusting the copper concentration in the SnAgCu solders. If the SnAgCu solder has a copper concentration higher than or equivalent to 0.6 wt. %, the soldering intermetallic compound includes a continuous $(Cu_{1-x}Ni_x)_6Sn_5$ layer. If the copper concentration of the SnAgCu solders is lower than or equivalent to 0.4 wt. %, the soldering intermetallic compound includes a continuous $(Ni_{1-y}Cu_y)_3Sn_4$ layer and a non-continuous $(Cu_{1-x}Ni_x)_6Sn_5$ layer. If the copper concentration of the SnAgCu solders is between 0.4 wt. % to 0.6 wt. %, the soldering intermetallic compound includes the continuous $(Cu_{1-x}Ni_x)_6Sn_5$.

45 Claims, 14 Drawing Sheets

(Sn3.9Ag0.4Cu/Ni)

(Sn3.9Ag0.2Cu/Ni)

(Sn3.5Ag/Ni)

METHOD FOR CONTROLLING THE FORMATION OF INTERMETALLIC COMPOUNDS IN SOLDER JOINTS

CROSS-REFERENCE TO RELATED APPLICATION

This application claims the priority benefit of Taiwan application serial no. 90132,742, filed Dec. 28, 2001.

BACKGROUND OF THE INVENTION

1. Field of Invention

The present invention relates to a method for controlling the formation of an intermetallic compound in solder joints. More particularly, the present invention relates to a method for controlling the types of the intermetallic compounds formed between the SnAgCu solders and the Ni-bearing substrate by adjusting the copper concentration in the SnAgCu solder.

2. Description of Related Art

Integrated circuitry (IC) packaging is an important part of the semiconductor fabrication backend processes, which protects each chip and electrically connects the pads on the chips to the printed circuit board. The packages of the chip and the printed circuit board are connected through solders, while the soldering pads in contact with the solders commonly use Au/Ni or Pd/Ni bi-layer structure as a surface finish or a metallization. During the reflow soldering process, gold or palladium in the pad first reacts with the solder and was then merged into the solder. After using up gold or palladium, the underlying nickel keeps reacting with the solder to form soldering intermetallic compounds. If the mechanical strength of a solder joint is not strong enough, it may cause reliability problems.

The Pb—Sn solder is one of the most widely used materials for soldering. However, lead containing in the Pb—Sn solder, especially its oxides, can be toxic and harmful to the environment and human health. Therefore, lead-bearing solders are proposed to be banned in many countries.

To replace the lead-bearing solders, SnAgCu series of solders are generally considered to be one of the most promising replacements. The SnAgCu solders with different compositions have different physical and electrical properties. The prior art researches relating to SnAgCu solder series include U.S. Pat. No. 5,527,628 and Japanese Patent Application No. 2001-504760. The prior art researches mostly focus on the properties of SnAgCu solder series, rather than on the reactions between solders and pads or the soldering technique for connecting both. None of the prior art materials disclose a method for controlling the types of the intermetallic compounds between the SnAgCu solders and the Ni-bearing substrate by adjusting the compositions of the SnAgCu solders.

SUMMARY OF THE INVENTION

Accordingly, the invention provides a method for controlling the types of the intermetallic compounds between the SnAgCu solders and the Ni-bearing substrate by adjusting the compositions of the SnAgCu solders.

The present invention relates to a method for controlling the formation of the intermetallic compounds. The types of the intermetallic compounds between the SnAgCu solders and the Ni-bearing substrate can be controlled by adjusting the copper concentration in the SnAgCu solders.

As embodied and broadly described herein, the invention provides a method for controlling the formation of the intermetallic compounds. A substrate having a Ni-bearing bonding pad, for example, Au/Ni double-layered pad or Pd/Ni double-layered pad, is provided. An amount of SnAgCu solder is formed on the Ni-bearing pad. A reflow soldering process is performed, so that the SnAgCu solder reacts with the Ni-bearing pad to form a solder joint. If the copper concentration in SnAgCu solder is between 0.6 wt. % to 3.0 wt. % (including 0.6 wt. %), the continuous soldering intermetallic interlayer formed at the interface is a $(Cu_{1-x}Ni_x)_6Sn_5$ layer. If the copper concentration in SnAgCu solder is between 0 wt. % to 0.4 wt. % (including 0.4 wt. %), the continuous soldering interlayer is a $(Ni_{1-y}Cu_y)_3Sn_4$ layer. If the copper concentration in the SnAgCu solder is between 0.4 wt. % to 0.6 wt. %, the soldering interlayer is a composite layer including the continuous $(Cu_{1-x}Ni_x)_6Sn_5$ layer and the continuous $(Ni_{1-y}Cu_y)_3Sn_4$ layer.

The present invention relates to a method for controlling the formation of the intermetallic compounds. The types of the intermetallic compounds can be controlled by adjusting the minor copper concentration in the SnAgCu solders.

The method of the present invention for controlling the formation of the intermetallic compounds can not only control the types of the intermetallic compounds, but also growth rates of the soldering intermetallic compounds.

The method of the present invention for controlling the formation of the intermetallic compounds is greatly influenced by the copper concentration in the solder. Particularly, if the copper concentration is between 0.4 wt. % to 0.6 wt. %, the types of the intermetallic compounds can vary significantly due to minor processing errors in Cu concentration, further deteriorating reliability of the solder. Therefore, the present invention provides a method for controlling the formation of desirable intermetallic compounds at the interface.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 6a is a cross-sectional view for the soldering intermetallic compounds after the Ni pad reacting with the solder containing 0.4 wt. % copper for 10 minutes under 250° C., taken by the electron microscope, while FIG. 6b is a magnifying view of FIG. 6a;

FIG. 12a is a cross-sectional view for the soldering intermetallic compounds after the Ni pad reacting with the solder containing 0.5 wt. % copper for 10 minutes under 250° C., taken by the electron microscope, while FIG. 12b is a magnifying view of FIG. 12a;

FIG. 14a is a cross-sectional view for the soldering intermetallic compounds after the Ni pad reacting with the solder containing 0.5 wt. % copper for 25 hours under 250° C., taken by the electron microscope, while FIG. 14b is a magnifying view of FIG. 14a.

DESCRIPTION OF THE PREFERRED EMBODIMENTS

In the present invention, the copper concentrations of the SnAgCu solder series are adjusted to 0~3.0 wt. %; that is, different amounts of copper are mixed into the solder before soldering to adjust the copper concentrations.

The mixed copper can distribute evenly in the solder and react with tin to form $Cu_6Sn_5$ intermetallic compounds. The more the copper is added into the solder, the more the resultant $Cu_6Sn_5$ particles are. The sizes of the $Cu_6Sn_5$ particles in the solder depend on the cooling rates in the reflow soldering process. The faster the cooling rate of the solder is, the smaller the size of the $Cu_6Sn_5$ particle is. It is beneficial for the mechanical strength of the solder to form small and evenly distributed $Cu_6Sn_5$ particles in the solder. Moreover, it is favorable to contain tiny amounts of copper in the SnAg solder for lowering the liquidizing temperature of the solder. The silver concentration of the solder is between 3.5 wt. % to 4 wt. %. Silver will react with tin in the solder to form $Ag_3Sn$ intermetallic compounds that distribute evenly in the solder.

FIGS. 1a–1h are schematic diagrams for the structures and the growth states of the intermetallic compounds by adjusting the copper concentration in the SnAgCu solders according to one preferred embodiment of this invention, while the copper concentration for each diagram is shown on the top line respectively. From FIGS. 1a–1d, it clearly shows that the resultant soldering intermetallic compound is a continuous layer of the $(Cu_{1-x}Ni_x)_6Sn_5$ intermetallic compounds in each diagram for the solders containing copper equivalent to or more than 0.6 wt. %. From FIGS. 1e–1g, it clearly shows that both the $(Ni_{1-y}Cu_y)_3Sn_4$ intermetallic compound and the $(Cu_{1-x}Ni_x)_6Sn_5$ intermetallic form for the solders containing copper between 0.2~0.5 wt. %. However, as the copper concentration decreases, the $(Ni_{1-y}Cu_y)_3Sn_4$ intermetallic compounds underlying the $(Cu_{1-x}Ni_x)_6Sn_5$ intermetallic layer become more and $(Cu_{1-x}Ni_x)_6Sn_5$ becomes less. If the copper concentration decreased to as low as 0.4 wt. % (see FIG. 1f), the $(Cu_{1-x}Ni_x)_6Sn_5$ intermetallic layer becomes non-continuous and can not cover the interface. If the copper concentration decreased to equivalent to or lower than 0.4 wt. % (see FIGS. 1f and 1g), the resultant $(Ni_{1-y}Cu_y)_3Sn_4$ intermetallic compounds become a continuous layer at the interface, connecting the solder and the bonding pad.

Figure 1:
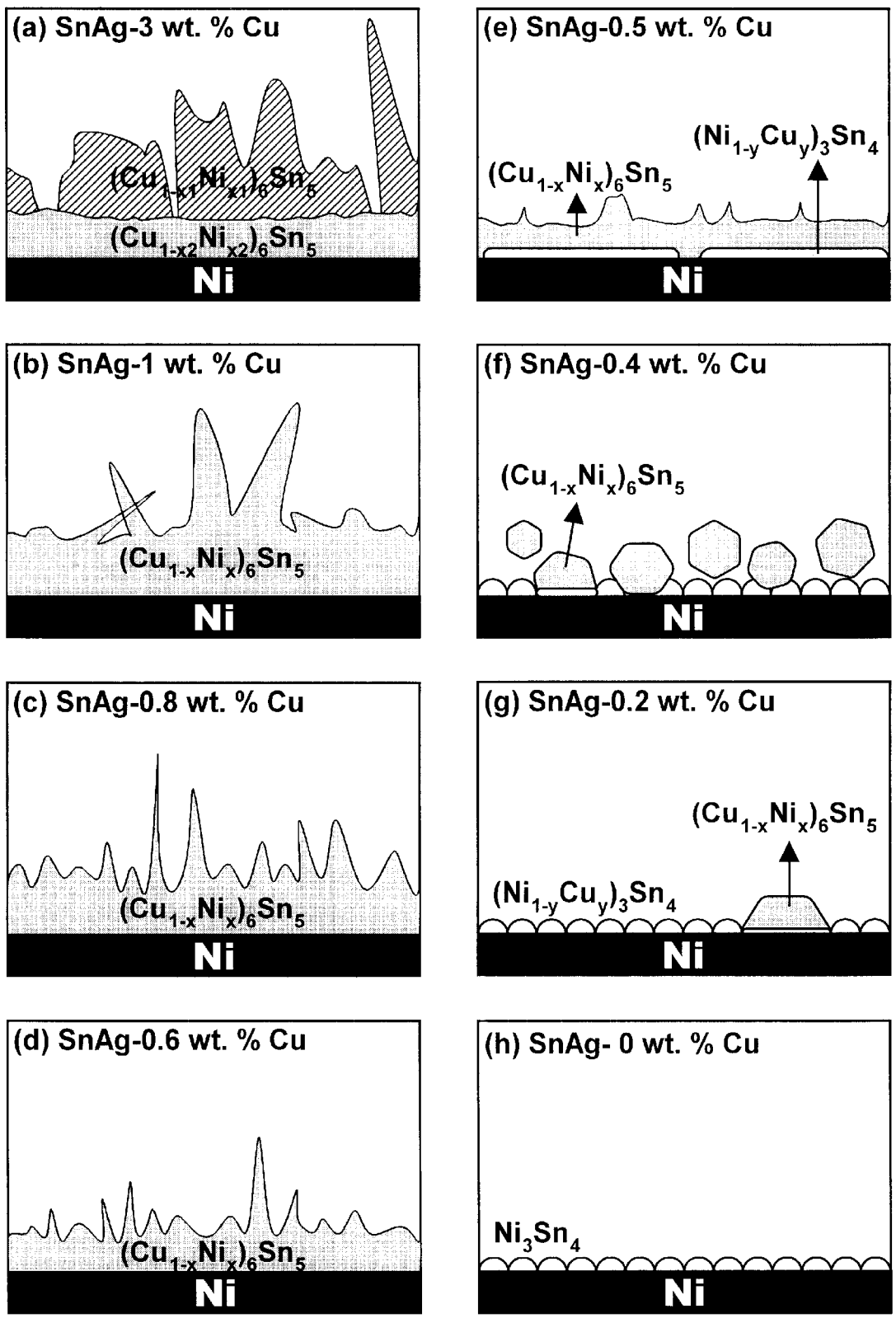
FIGS. 1a–1h are schematic diagrams for the structures and the growth states of the intermetallic compounds by adjusting the copper concentration in the SnAgCu solders according to one preferred embodiment of this invention, while the copper concentration for each diagram is shown on the top line respectively.

The copper concentration in FIG. 1h is 0 wt. %, i.e. copper-free. Of course, there is no $Cu_6Sn_5$ intermetallic compound existing in the copper-free solder. Therefore, there is only one layer of $Ni_3Sn_4$ $((Ni_{1-y}Cu_y)_3Sn_4, y=0)$ intermetallic compound at the interface.

In conclusion, as the copper concentration decreases, the resultant intermetallic compound at the interface changes from a single $(Cu_{1-x}Ni_x)_6Sn_5$ intermetallic layer to $(Cu_{1-x}Ni_x)_6Sn_5$ and $(Ni_{1-y}Cu_y)_3Sn_4$ coexisting. If the copper concentration further decreases, the interlayer at the interface turns into a $(Ni_{1-y}Cu_y)_3Sn_4$ intermetallic layer. That is, as the copper concentrations in the solder change, the structures and the growth states of the resultant intermetallic compounds vary accordingly. The present invention is characterized in that the structures and growth states of the intermetallic compounds at the interface between the pad and the solder can be controlled by adjusting the copper concentration in the SnAgCu solder series.

Moreover, the growth rates for $(Cu_{1-x}Ni_x)_6Sn_5$ and $(Ni_{1-y}Cu_y)_3Sn_4$ are quite different. In the present invention, the growth rate of $(Cu_{1-x}Ni_x)_6Sn_5$ at the interface is much faster than that of $(Ni_{1-y}Cu_y)_3Sn_4$ during the soldering. Even only the $(Cu_{1-x}Ni_x)_6Sn_5$ intermetallic layer is formed at the interface (the copper concentration is higher than 0.6 wt. %), the growth rate of $(Cu_{1-x}Ni_x)_6Sn_5$ at the interface increases along with the increasing copper concentration.

The present invention only adjust the copper concentration in the solder to a small extent (0~3 wt. %). Since the copper content in the solder is relatively low (less than 3 wt. %), the present invention will not significantly change the original properties of the solder, thus compatible with the present soldering processes. Furthermore, adding tiny amounts of copper into the solders can effectively prevent formation of fragile Au—Ni—Sn intermetallic compounds. In addition to adding Cu into the solder, the copper atoms also can come from dissolution of Cu pad that is in contact with the solder.

The present invention is not limited to any specific structures or states of intermetallic compounds; instead, the structures and states of the desired intermetallic compounds at the interface can be adjusted depending on the industrial requirements.

The method of the present invention for controlling the formation of the intermetallic compounds can not only control the structures and growth states of the intermetallic compounds, but also growth rates of the soldering intermetallic compounds.

The present invention relates to a method for controlling the structures and growth states of the intermetallic compounds by adjusting the minor copper concentration in the solders. One preferred embodiment of the present invention is described as follows.

Embodiment

The SnAgCu solder series used in the present invention is listed in Table 1.

TABLE 1

| No. | Solder | Sn (wt. %) | Ag (wt. %) | Cu (wt. %) |
|-----|------------|------------|------------|------------|
| 1   | Sn3.5Ag    | 96.5       | 3.5        | 0          |
| 2   | Sn3.9Ag0.2Cu | 95.9     | 3.9        | 0.2        |
| 3   | Sn3.9Ag0.4Cu | 95.7     | 3.9        | 0.4        |
| 4   | Sn3.9Ag0.5Cu | 95.6     | 3.9        | 0.5        |
| 5   | Sn4.0Ag0.5Cu | 95.5     | 4.0        | 0.5        |
| 6   | Sn3.9Ag0.6Cu | 95.5     | 3.9        | 0.6        |
| 7   | Sn3.9Ag0.7Cu | 95.4     | 3.9        | 0.7        |
| 8   | Sn3.9Ag0.8Cu | 95.3     | 3.9        | 0.8        |
| 9   | Sn3.5Ag1.0Cu | 95.5     | 3.5        | 1.0        |
| 10  | Sn3.0Ag1.0Cu | 95.1     | 3.9        | 1.0        |
| 11  | Sn3.9Ag3.0Cu | 93.1     | 3.9        | 3.0        |

For the solder series listed in Table 1, the required preparations are described in the following: mixing tin, silver and copper according to the ratios listed in Table 1 to obtain an alloy. The alloy is then placed in a quartz tube for enfolding in vacuum and is then liquated under 700–850° C. in the furnace. Afterwards, the evenly mixed SnAgCu solder alloy is quenched. The SnAgCu solders with different compositions are placed in the furnace under 250° C., for the later reactions.

The Ni-bearing bonding pad for reacting with the solder is a nickel plate. The nickel plate is surface-polished and washed by a solution containing 50% volume HCl. Next, the nickel plate is bonded with a flux.

The processed nickel plate is welded to the melted SnAgCu solder under 250° C. for a reaction time of 2–10 minutes. After the soldering is completed, the intermetallic compounds formed at the soldering interface are then examined by an electronic probe microanalyzer (EPMA) for analyzing the compositions and by x-ray diffraction (XRD) for determining the crystal structures.

The method of the present invention can be divided into three types by controlling the formation of the following three states for the soldering interface: forming "$(Cu_{1-x}Ni_x)_6Sn_5$ interlayer", "$(Cu_{1-x}Ni_x)_6Sn_5$ and $(Ni_{1-y}Cu_y)_3Sn_4$ coexisting interlayer" and "$(Ni_{1-y}Cu_y)_3Sn_4$ interlayer".

For forming "$(Cu_{1-x}Ni_x)_6Sn_5$ interlayer" (0.6–3 wt. % Cu)

FIGS. 2a–2d are cross-sectional views for the soldering intermetallic compounds after the Ni pad reacting with the solder containing 0.6 wt. % to 1 wt. % copper for 10 minutes under 250° C., taken by the electron microscope, while the copper concentration for each diagram is shown on the top line respectively. FIGS. 3a–3d are top views for the corresponding FIGS. 2a–2d, while the copper concentration for each diagram is shown on the top line respectively.

From FIGS. 2a–2d and 3a–3d, the resultant intermetallic compounds at the interface between the Ni pad and the solder series, including 0.6 wt. % Cu solder (Sn3.9Ag0.6Cu), 0.7 wt. % Cu solder (Sn3.9Ag0.7Cu), 0.8 wt. % Cu solder (Sn3.9Ag0.8Cu) and 1.0 wt. % Cu solder (Sn3.5Ag1.0Cu), have different states. As the copper concentration increases in the solder, the shapes of the resultant intermetallic compounds change from short hexagonal spindle-shaped structures to long hexagonal spindle-shaped structures. For the copper concentrations between 0.6 to 1 wt. %, only one single intermetallic interlayer is formed at the interface. This intermetallic interlayer is analyzed by EPMA to be a compound consisting of copper, tin and nickel (Cu—Ni—Sn intermetallic compound), and the average compositions (atomic ratios) are listed in Table 2.

| No. | Solder | Cu (at. %) | Ni (at. %) | Sn (at. %) |
|-----|------------|------------|------------|------------|
| 6   | Sn3.9Ag0.6Cu | 32.2 | 21.2 | 46.6 |
| 7   | Sn3.9Ag0.7Cu | 33.6 | 19.7 | 46.7 |
| 8   | Sn3.9Ag0.8Cu | 36.8 | 18.6 | 44.6 |
| 9   | Sn3.5Ag1.0Cu | 44.1 | 10.7 | 45.2 |

As the copper concentration of the SnAgCu solder increases, the copper atomic ratio in the Cu—Ni—Sn intermetallic compound increases (from 32.2 at. % to 44.1 at. %) and the nickel atomic ratio decreases (from 21.2 at. % to 10.7 at. %). The tin atomic ratio in the Cu—Ni—Sn intermetallic compound remains a narrow range between 44.6–46.7 at. %, rather than varying along with changes of the copper concentration in the solder. The ratio between the combined atomic ratios of copper and nickel (~55 at. %) and the tin atomic ratio (~45 at. %) is within the composition range of $(Cu_{1-x}Ni_x)_6Sn_5$ compounds. Therefore, the Cu—Ni—Sn intermetallic compounds should be $(Cu_{1-x}Ni_x)_6Sn_5$ compounds. In order to see whether the Cu—Ni—Sn intermetallic compounds are $(Cu_{1-x}Ni_x)_6Sn_5$ compounds, x-ray diffraction is used to analyze these compounds as shown in FIGS. 3a–3d.

Figure 4:
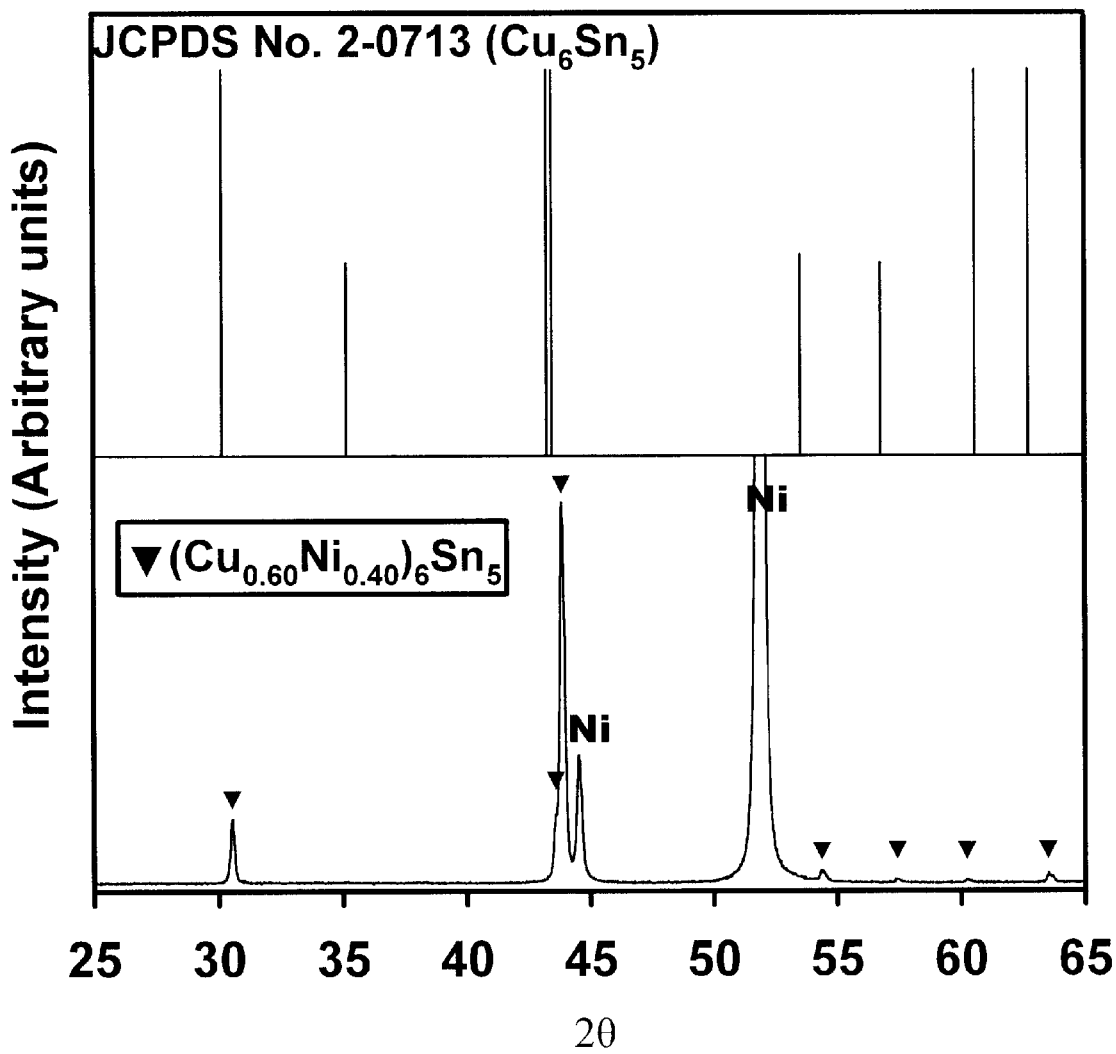
FIG. 4 is a comparison figure between x-ray diffraction spectrums for Cu—Ni—Sn intermetallic compound and $Cu_6Sn_5$ (JCPDS)

FIG. 4 is a comparison figure between x-ray diffraction spectrums for Cu—Ni—Sn intermetallic compound and $Cu_6Sn_5$ (JCPDS).

Referring to FIG. 4, the x-ray spectrums of the Cu—Ni—Sn intermetallic compound and $Cu_6Sn_5$ (JCPDS) are similar. However, compared with $Cu_6Sn_5$ (JCPDS), the peaks in the x-ray spectrum of the Cu—Ni—Sn intermetallic compound shift toward larger angles. It is because smaller nickel atoms dissolve into $Cu_6Sn_5$ and occupy the sub-lattice locations of bigger copper atoms, thus forming the $(Cu_{1-x}Ni_x)_6Sn_5$ compounds. Considering the composition analysis of the Cu—Ni—Sn intermetallic compounds by EPMA, it is concluded that Cu—Ni—Sn intermetallic compounds are indeed $(Cu_{1-x}Ni_x)_6Sn_5$ compounds. Therefore, the copper concentration in the SnAgCu solder should be controlled between 0.6 wt. % to 1 wt. %, in order to form the $(Cu_{1-x}Ni_x)_6Sn_5$ interlayer at the interface.

On the other hand, if the copper concentration is higher (for example, higher than 3 wt. %), there are two different compositions of the $(Cu_{1-x}Ni_x)_6Sn_5$ intermetallic compounds formed at the interface.

FIGS. 5a and 5b are respectively a cross-sectional view and a top view for the soldering intermetallic compound after the Ni pad reacting with the solder containing 3 wt. % copper for 10 minutes under 250° C., taken by the electron microscope.

Referring to FIG. 5a, there are two different compositions of intermetallic compounds formed at the interface while the copper concentration is 3 wt. %. For these two different compositions of the $(Cu_{1-x}Ni_x)_6Sn_5$ intermetallic compounds, one compound forms a continuous layer on the Ni pad, while the other compound is formed on the continuous layer in a non-continuous form. Theses two compositions are $(Cu_{0.83}Ni_{0.17})_6Sn_5$ (continuous) and $(Cu_{0.91}Ni_{0.09})_6Sn_5$ (non-continuous) respectively. $(Cu_{0.91}Ni_{0.09})_6Sn_5$ is not only different from $(Cu_{0.83}Ni_{0.17})_6Sn_5$ in composition, but also different from the $(Cu_{1-x}Ni_x)_6Sn_5$ (x≈0) compounds coming from the solder. From FIG. 5b, as the copper concentration of the solder increases, the shapes of the soldering intermetallic compounds at the interface change from hexagonal spindle-shaped structures into hexagonal columns.

Figure 2:
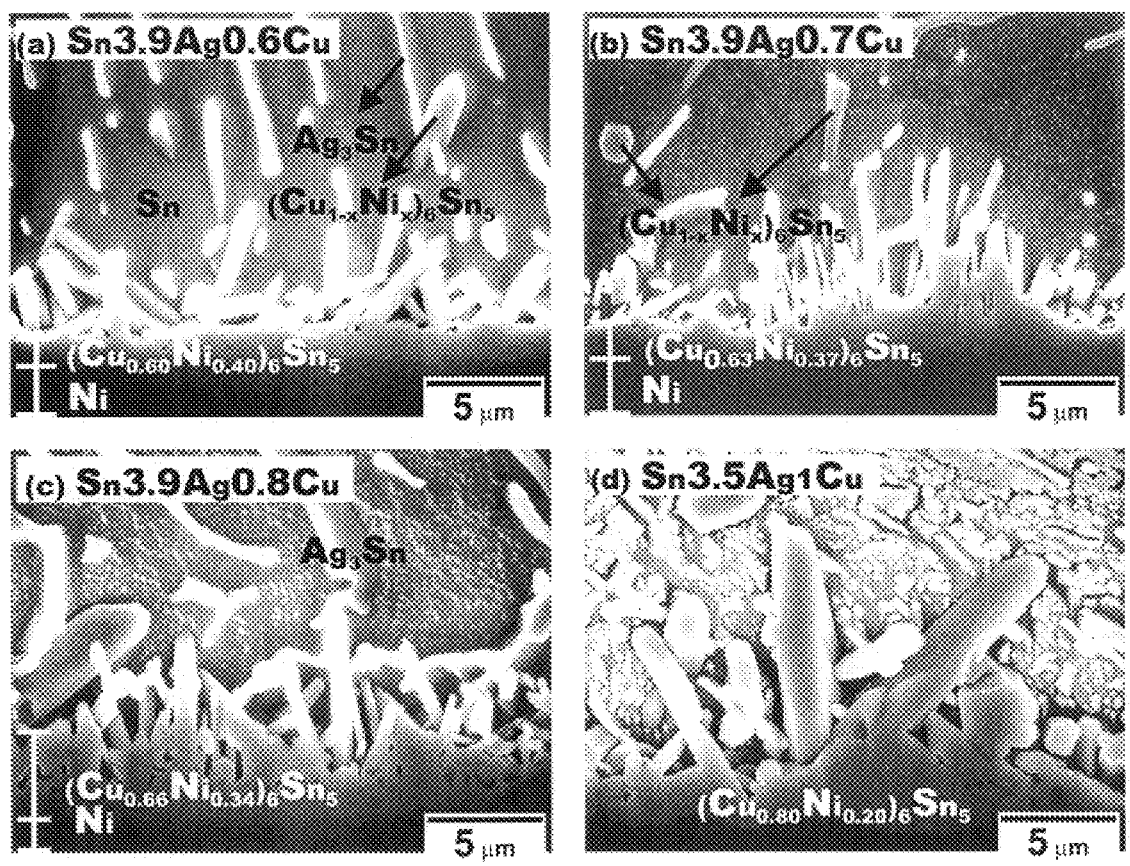
FIGS. 2a–2d are cross-sectional views for the soldering intermetallic compounds after the Ni pad reacting with the solder containing 0.6 wt. % to 1 wt. % copper for 10 minutes under 250° C., taken by the electron microscope, while the copper concentration for each diagram is shown on the top line respectively.
Figure 3:
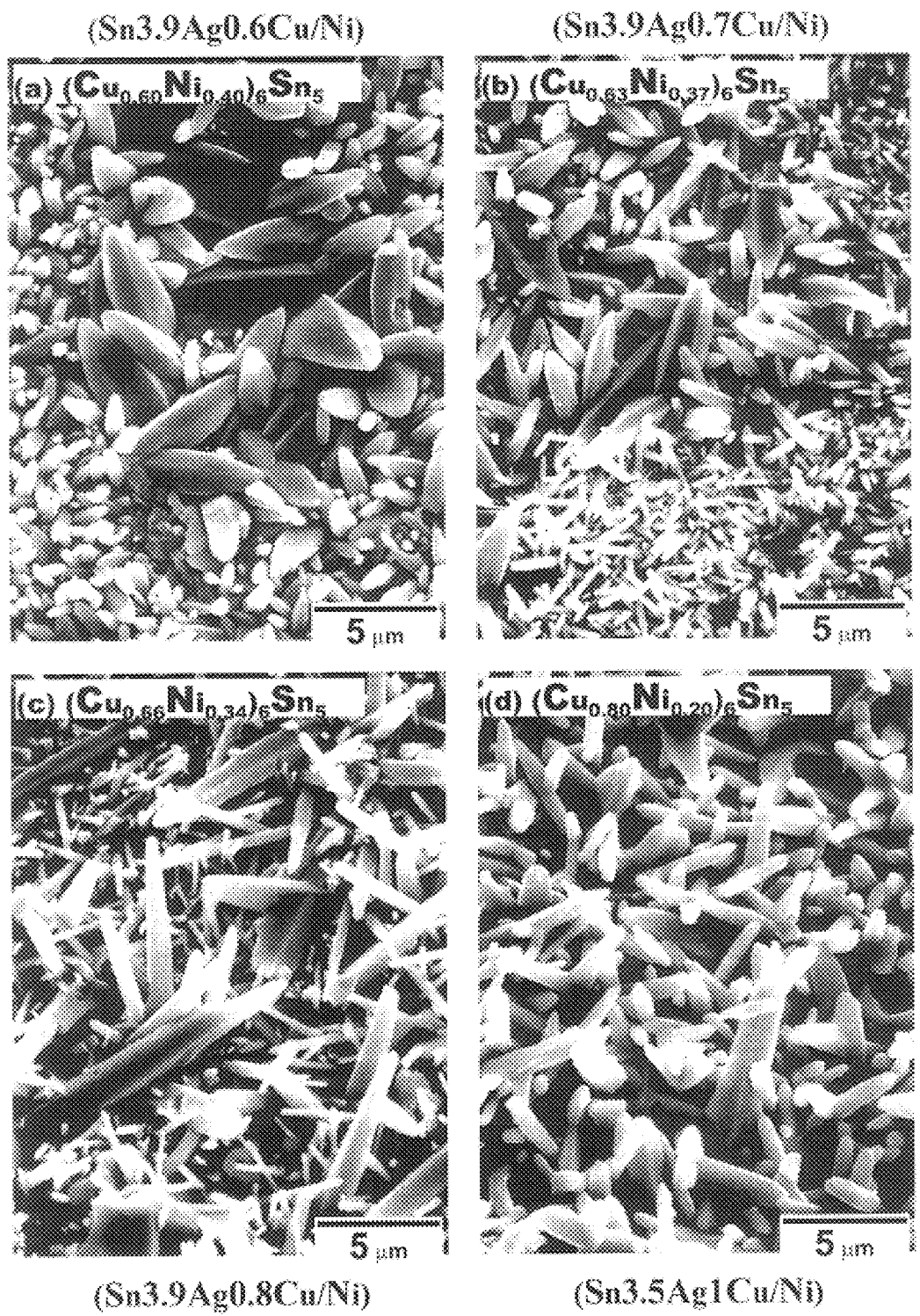
FIGS. 3a–3d are top views for the corresponding FIGS. 2a–2d, while the copper concentration for each diagram is shown on the top line respectively.
Figure 5:
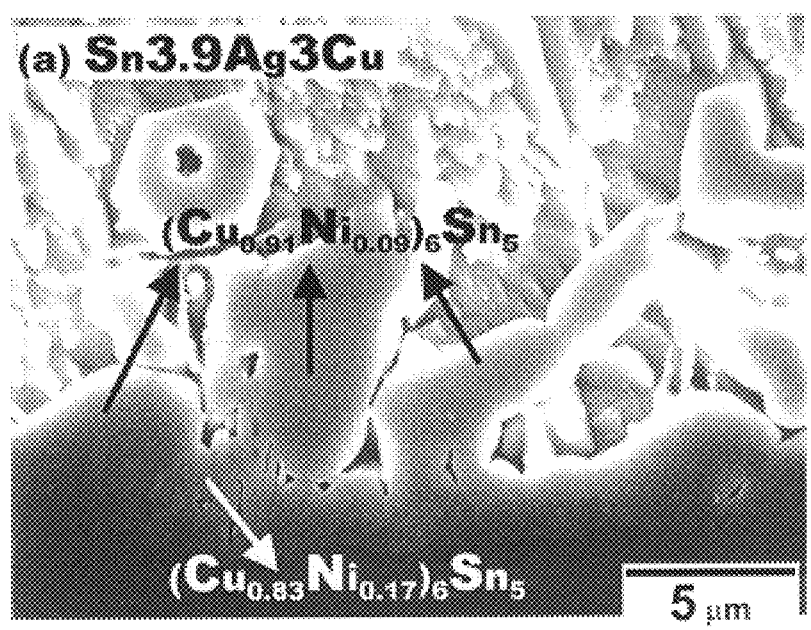
FIGS. 5a and 5b are respectively a cross-sectional view and a top view for the soldering intermetallic compound after the Ni pad reacting with the solder containing 3 wt. % copper for 10 minutes under 250° C., taken by the electron microscope.
Figure 5:
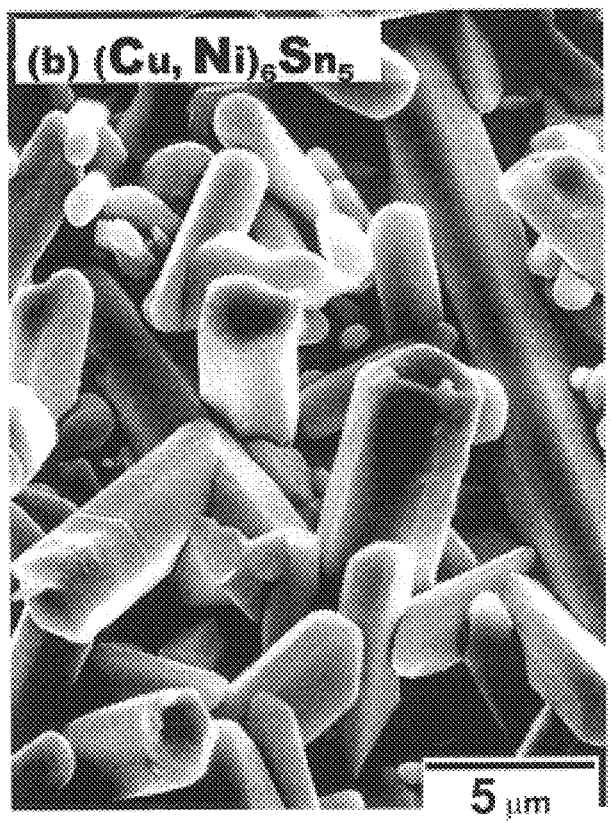

Moreover, from FIGS. 2 and 5, the growth rates of the $(Cu_{1-x}Ni_x)_6Sn_5$ compounds vary significantly as the copper concentration in the solder increases. The higher the copper concentration is, the fast the growth rate of the $(Cu_{1-x}Ni_x)_6Sn_5$ compound is. Therefore, the present invention can control the growth rates of the $(Cu_{1-x}Ni_x)_6Sn_5$ intermetallic compounds at the interface between the pad and the solder by adjusting the copper concentration of the solder. Therefore, the copper concentration in the SnAgCu solders should be controlled between 0.6 wt. % to 3 wt. %, in order to form the $(Cu_{1-x}Ni_x)_6Sn_5$ interlayer at the interface. If a thin $(Cu_{1-x}Ni_x)_6Sn_5$ interlayer is preferred, it is better to apply the solders with lower copper concentrations. For forming "$(Ni_{1-y}Cu_y)_3Sn_4$ interlayer"

As the copper concentration is as low as 0–0.4 wt. %, the soldering interlayer formed at the interface is completely different from the aforementioned $(Cu_{1-x}Ni_x)_6Sn_5$ layer.

Figure 6:
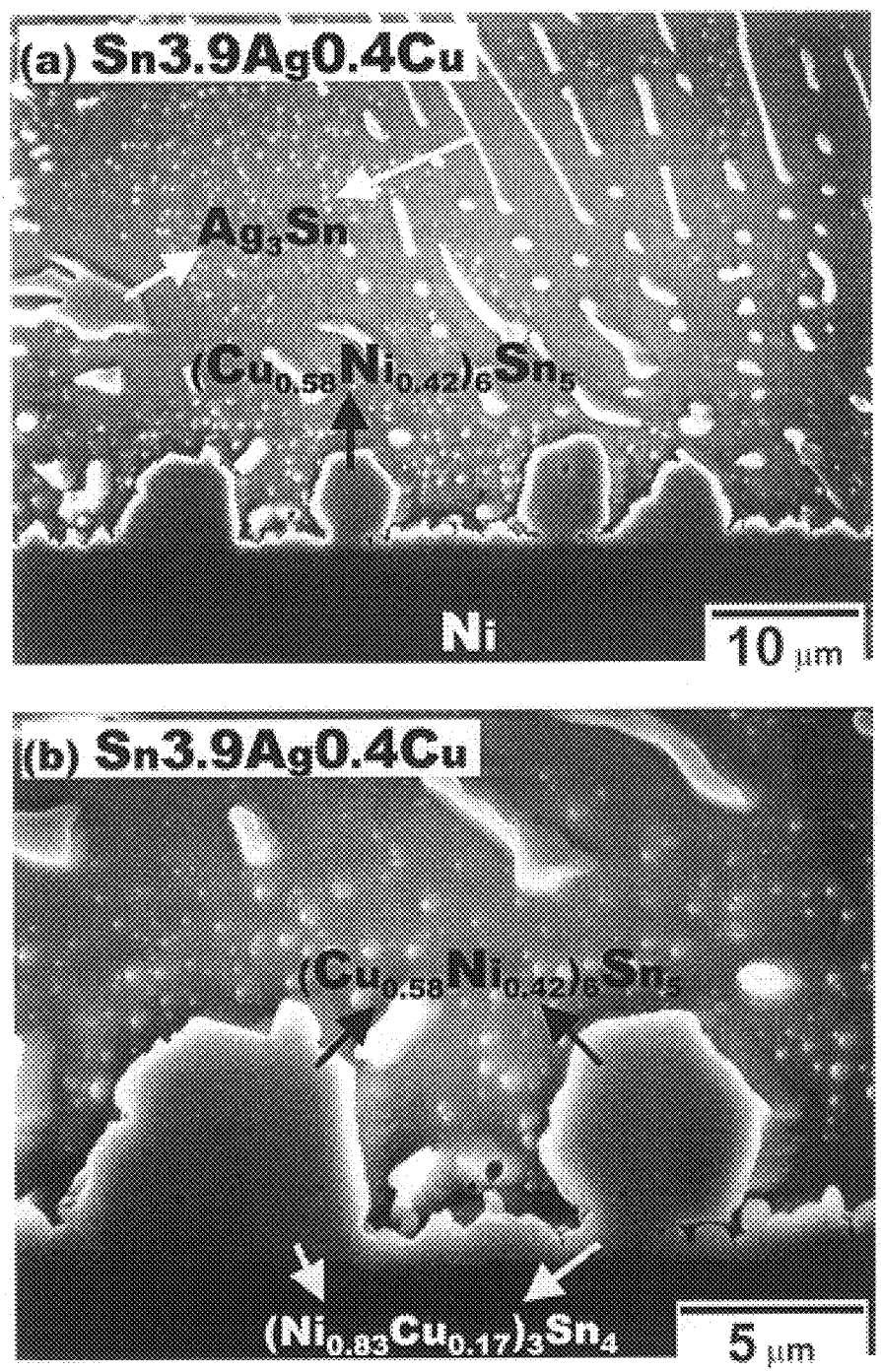
Figure 7:
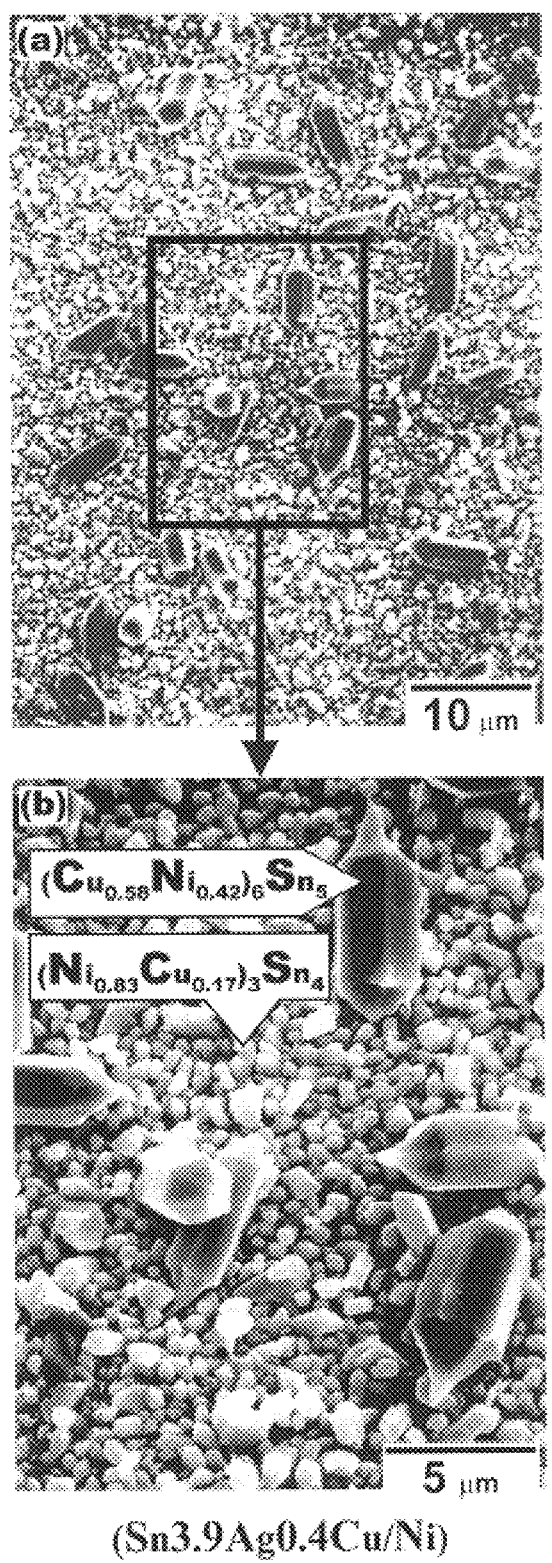
FIGS. 7a–7b are top views for the corresponding FIGS. 6a–6b respectively.

FIG. 6a is a cross-sectional view for the soldering intermetallic compound after the Ni pad reacting with the solder containing 0.4 wt. % copper for 10 minutes under 250° C., taken by the electron microscope, while FIG. 6b is a magnifying view of FIG. 6a. FIGS. 7a–7b are top views for the corresponding FIGS. 6a–6b respectively.

There are two kinds of intermetallic compounds formed at the interface while the copper concentration is 0.4 wt. %. Referring to FIGS. 6a–6b, one compound of these two intermetallic compounds forms a continuous layer on the pad and is lump-like, while the other compound covers the continuous layer in a non-continuous form and is hexagonal. From FIGS. 7a–7b, the compounds having hexagonal cross-sections are hexagonal spires, distributed evenly on the continuous layer of the lump-like compounds. From the analysis of EPMA, these hexagonal spires are in fact $(Cu_{1-x}Ni_x)_6Sn_5$ compounds, while the underlying lump-like compounds have an average composition of copper 7.3 at. %, nickel 36.5 at. % and tin 56.2 at. %, which is very different from the composition of the aforementioned $(Cu_{0.58}Ni_{0.42})_6Sn_5$ (Cu 32.2 at. %, Ni 23.7 at. %, Sn 44.1 at. %).

Figure 8:
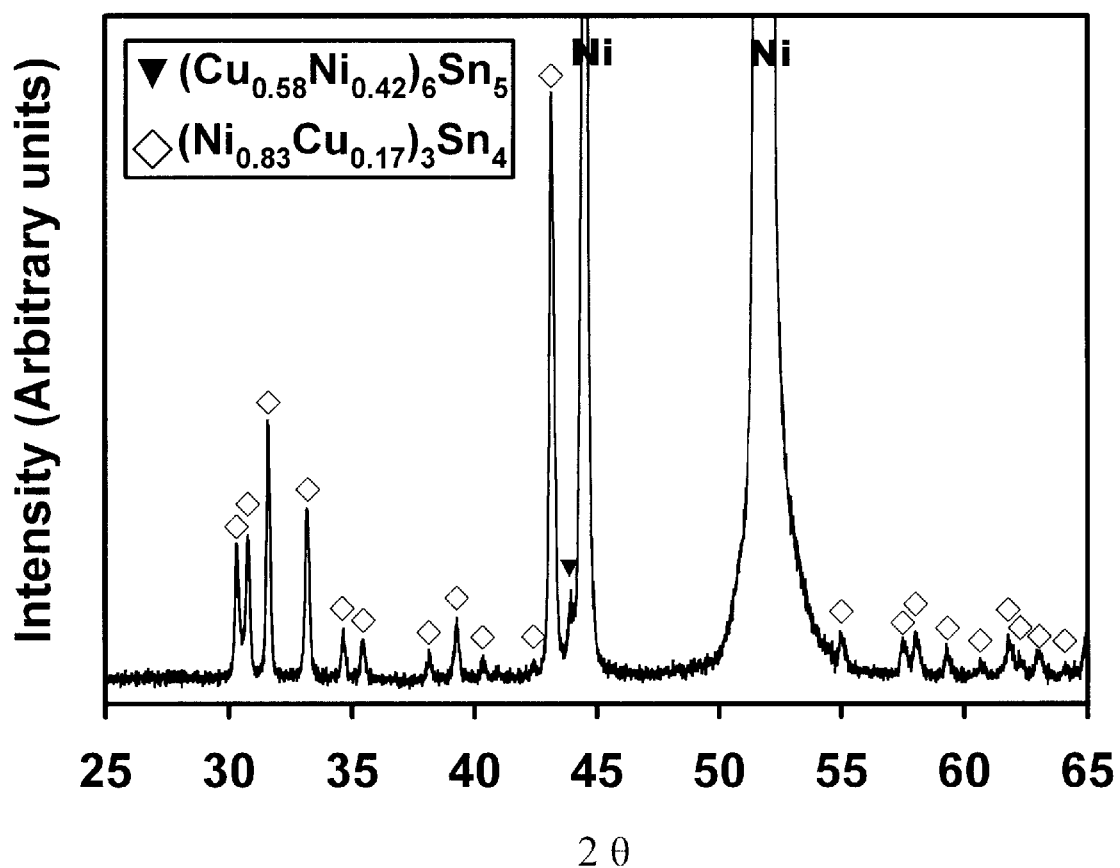
FIG. 8 is the x-ray diffraction spectrum of the intermetallic compounds of FIG. 7.

In order to see whether the lump-like intermetallic compounds are $(Ni_{1-y}Cu_y)_3Sn_4$ compounds, x-ray diffraction is used to analyze these compounds. FIG. 8 is the x-ray diffraction spectrum of the intermetallic compound of FIG. 7.

Referring to FIG. 8, there are both $(Cu_{1-x}Ni_x)_6Sn_5$ and $(Ni_{1-y}Cu_y)_3Sn_4$ coexisting at the interface, as the copper concentration is lowered to 0.4 wt. %. From the analysis of EPMA and x-ray, it is concluded that the lump-like compound is $(Ni_{1-y}Cu_y)_3Sn_4$ (y=0.17) and the hexagonal spire compound is $(Cu_{1-x}Ni_x)_6Sn_5$ (x=0.42). From FIGS. 6–8, it clearly shows that the composition of the continuous interlayer at the interface is changed from $(Cu_{1-x}Ni_x)_6Sn_5$ into $(Ni_{1-y}Cu_y)_3Sn_4$, as the copper concentration of the solder shifts from 0.6 wt. % to 0.4 wt. %. Therefore, the composition shift of the continuous interlayer at the soldering interface occurs within the copper concentration range of 0.4–0.6 wt. %.

Figure 9:
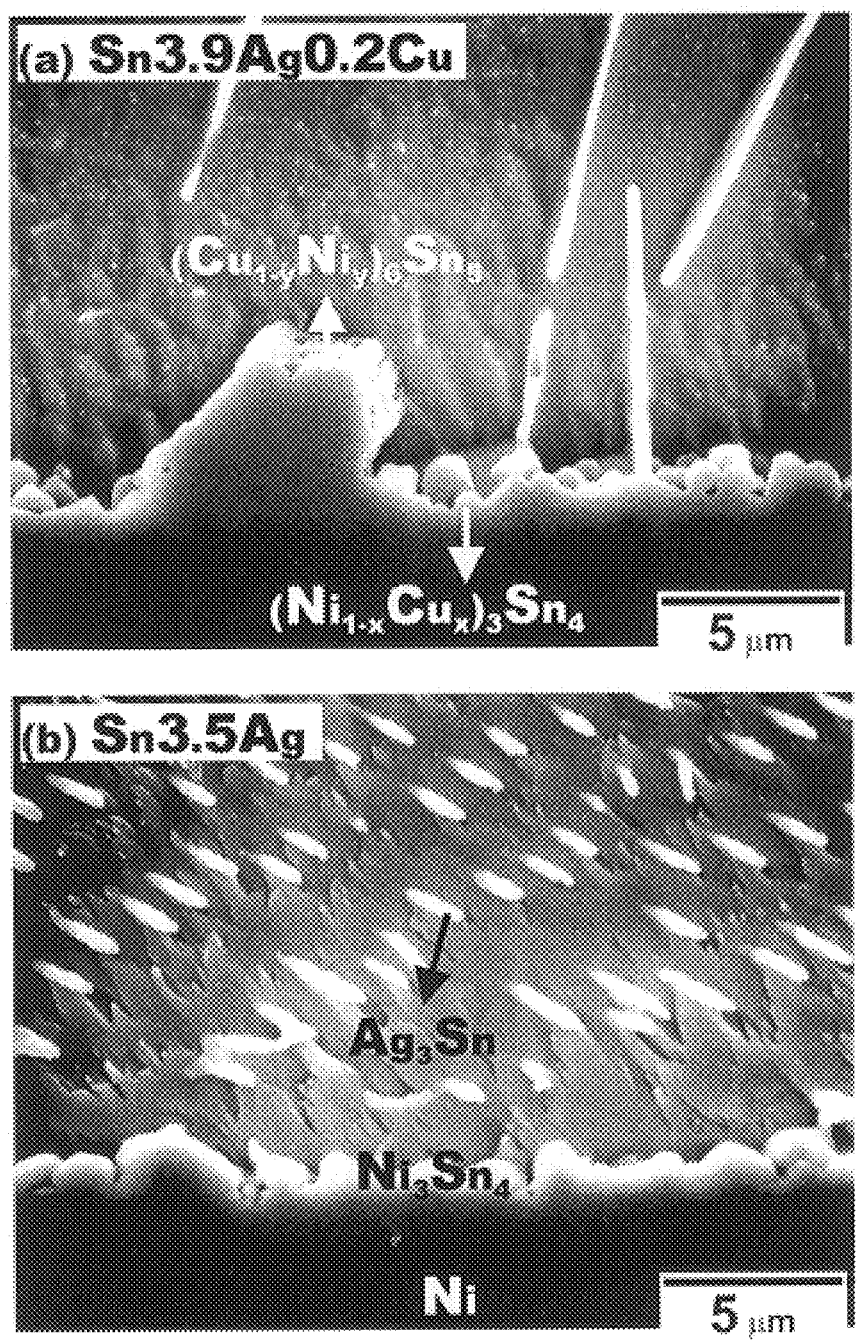
FIGS. 9a–9b are cross-sectional views for the soldering intermetallic compounds after the Ni pad reacting with the solder containing 0 wt. % to 0.2 wt. % copper for 10 minutes under 250° C., taken by the electron microscope, while the copper concentration for each diagram is shown on the top line respectively.
Figure 10:
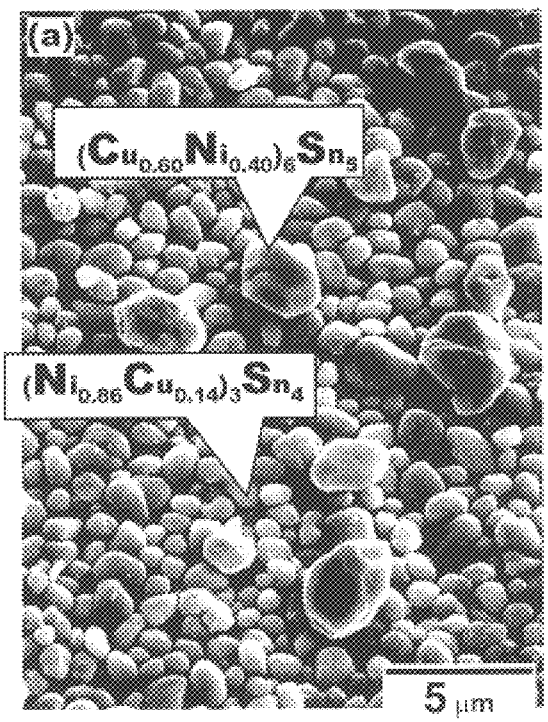
FIGS. 10a–10b are top views for the corresponding FIGS. 9a–9b, while the copper concentration for each diagram is shown on the top line respectively.
Figure 10:
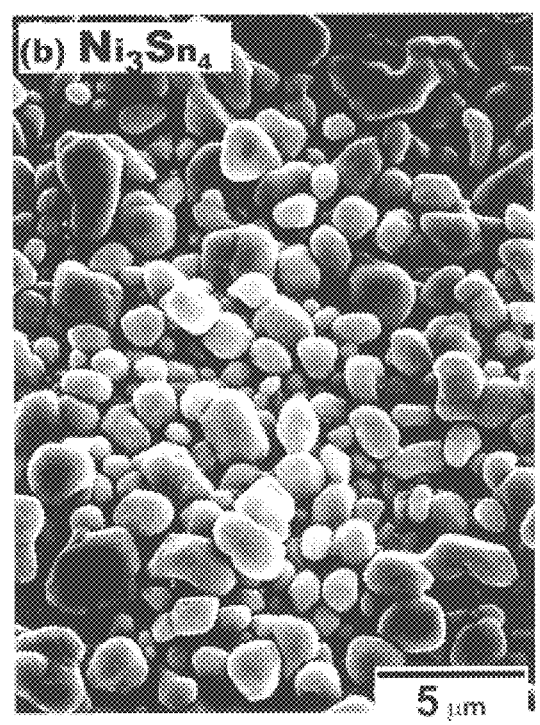

FIGS. 9a–9b are cross-sectional views for the soldering intermetallic compounds after the Ni pad reacting with the solder containing 0 wt. % to 0.2 wt. % copper for 10 minutes under 250° C., taken by the electron microscope, while the copper concentration for each diagram is shown on the top line respectively. FIGS. 10a–10b are top views for the corresponding FIGS. 9a–9b, while the copper concentration for each diagram is shown on the top line respectively.

Referring to FIGS. 9a–10b, the mass (size) of the $(Cu_{1-x}Ni_x)_6Sn_5$ layer at the interface keeps decreasing as the copper concentration becomes lower. From FIG. 9a, the copper concentration in the solder is 0.2 wt. % (Sn3.9Ag0.2Cu), the $(Cu_{1-x}Ni_x)_6Sn_5$ compound above $(Ni_{1-y}Cu_y)_3Sn_4$ decreases to less than 5% of the interface area, while there is only one $(Ni_{1-y}Cu_y)_3Sn_4$ continuous interlayer present at the interface, as shown in FIG. 9b, with a copper concentration of 0 wt. % (Sn3.5Ag).

Figure 11:
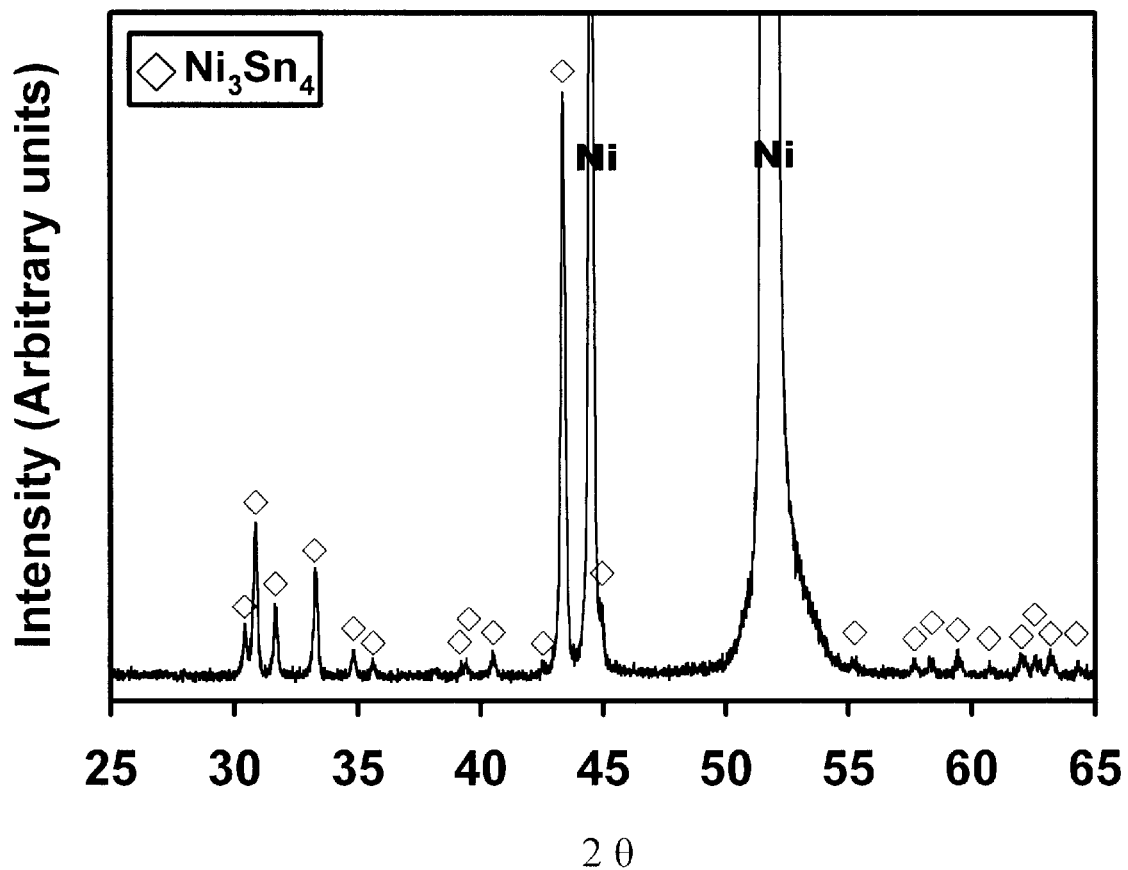
FIG. 11 is the x-ray diffraction spectrum of $Ni_3Sn_4$ intermetallic compound.

FIG. 11 is the x-ray diffraction spectrum of $Ni_3Sn_4$ intermetallic compounds. From the analysis of x-ray, it is confirmed that the intermetallic compound formed at the interface is a $(Ni_{1-y}Cu_y)_3Sn_4$ intermetallic layer while the copper concentration of the solder is 0 wt. % (Sn3.5Ag).

In conclusion, if the copper concentration of the solder is equivalent to or lower than 0.4 wt. %, the continuous interlayer at the interface is a $(Ni_{1-y}Cu_y)_3Sn_4$ (y=0~0.17) intermetallic layer, no matter how low the copper concentration is. Therefore, as long as the copper concentration of the solder is defined between 0% to 0.4 wt. %, the composition of the continuous interlayer at the interface can be controlled to be $(Ni_{1-y}Cu_y)_3Sn_4$.

For forming "$(Cu_{1-x}Ni_x)_6Sn_5$ and $(Ni_{1-y}Cu_y)_3Sn_4$ coexisting interlayer"

As the copper concentration is between 0.4 wt. % to 0.6 wt. % (for example, 0.5 wt. %), there are two continuous intermetallic compounds present at the interface.

FIG. 12a is a cross-sectional view for the soldering intermetallic compound after the Ni pad reacting with the solder containing 0.5 wt. % copper for 10 minutes under 250° C., taken by the electron microscope, while FIG. 12b is a magnifying view of FIG. 12a.

From FIGS. 12a–12b, there are two intermetallic layers existing at the interface. Through the analysis of EPMA, the intermetallic layer near the solder is a $(Cu_{1-x}Ni_x)_6Sn_5$ layer, while the other layer near the Ni pad is very thin and its composition is determined as a compound containing copper, nickel and tin. The composition of the compound containing copper, nickel and tin is very different to $(Cu_{0.58}Ni_{0.42})_6Sn_5$.

Figure 12:
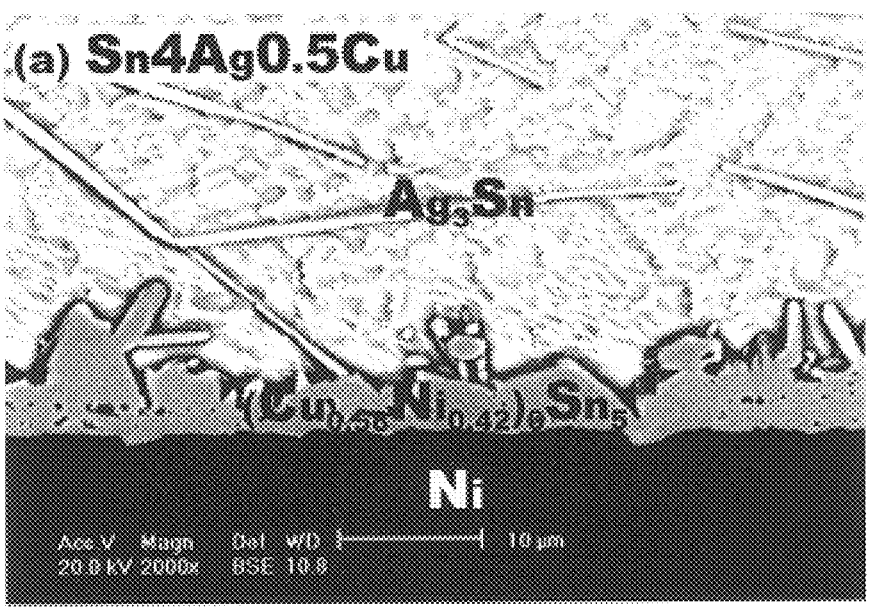
Figure 12:
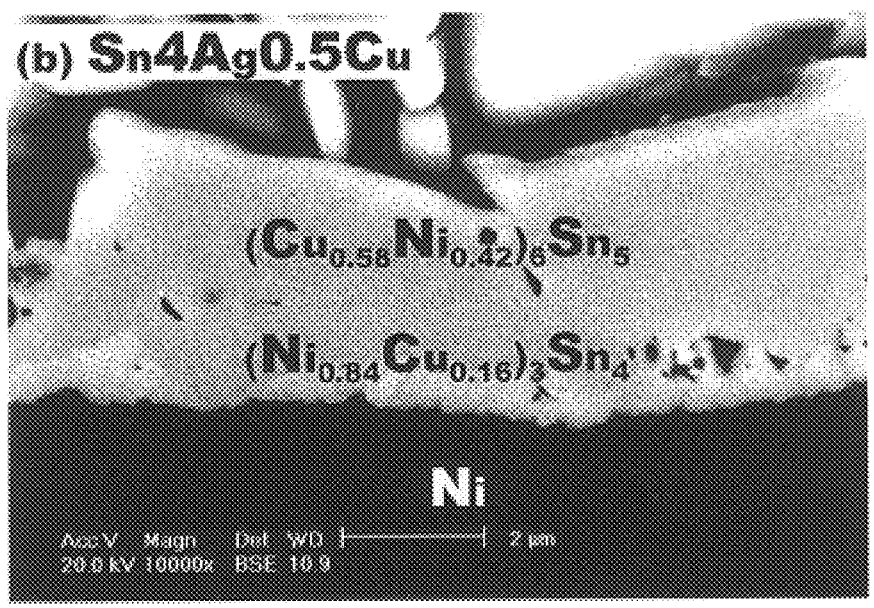
Figure 13:
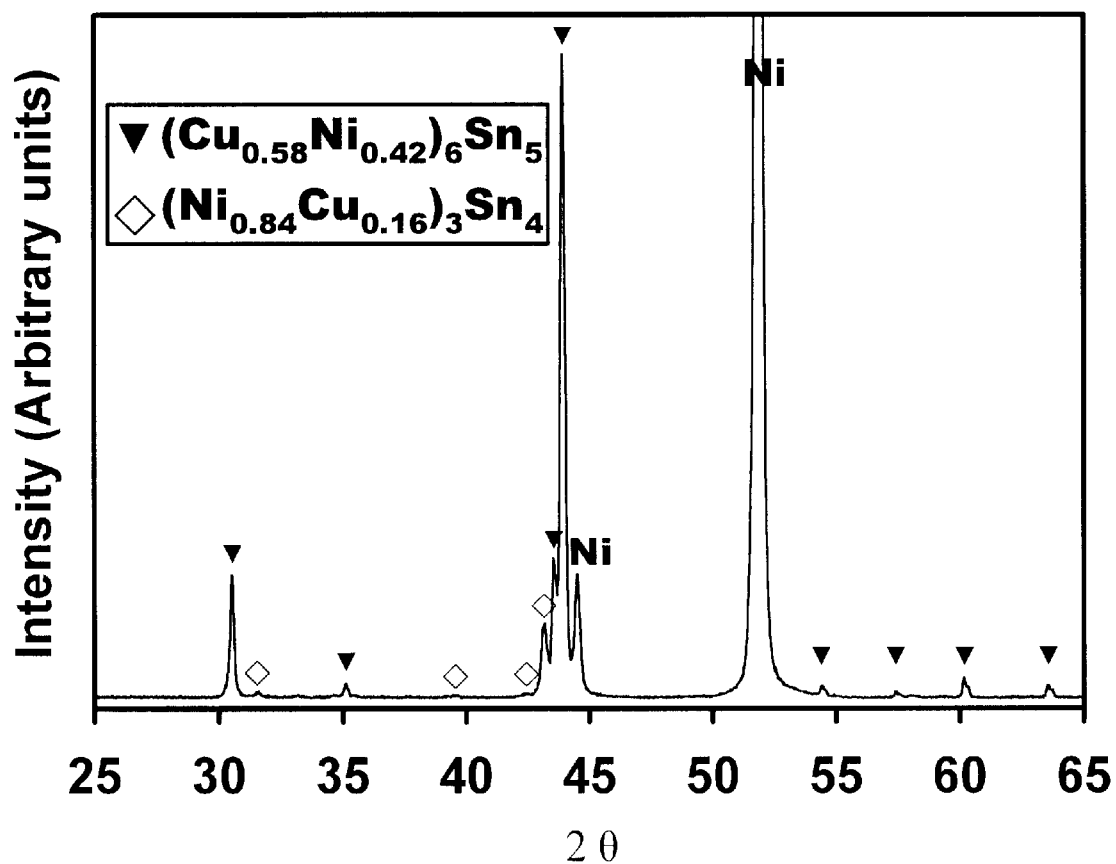
FIG. 13 is the x-ray diffraction spectrum of the intermetallic compounds of FIG. 12.

FIG. 13 is the x-ray diffraction spectrum of the intermetallic compound of FIG. 12. From the x-ray result, the soldering interlayer at the interface has both $(Cu_{1-x}Ni_x)_6Sn_5$ and $(Ni_{1-y}Cu_y)_3Sn_4$. Therefore, it is concluded that the compound containing copper, nickel and tin as a thin layer is $(Ni_{1-y}Cu_y)_3Sn_4$.

In order to precisely measured the composition of the thin layer near the Ni pad, the soldering time is extended to form thicker intermetallic layers, and then measured by EPMA.

FIG. 14a is a cross-sectional view for the soldering intermetallic compound after the Ni pad reacting with the solder containing 0.5 wt. % copper for 25 hours under 250° C., taken by the electron microscope, while FIG. 14b is a magnifying view of FIG. 14a.

Referring to FIGS. 14a–14b, the total thickness of the intermetallic layers at the interface is 56 microns, while the thickness of the layer near the Ni pad is about 5 microns. The composition of the compound containing copper, nickel and tin for the thin layer near the Ni pad is determined as: Cu 7.1 at. %, Ni 38.5 at. %, Sn 54.4 at. % [$(Ni_{0.84}Cu_{0.16})_3Sn_4$]. This average composition is similar to the composition of FIGS. 6a–6b and that [$(Ni_{0.83}Cu_{0.17})_3Sn_4$] of FIG. 9a. As for the $(Cu_{1-x}Ni_x)_6Sn_5$ compound, the average composition is $(Cu_{0.56}Ni_{0.44})_6Sn_5$, similar to the previous composition $(Cu_{0.58}Ni_{0.42})_6Sn_5$ under the soldering time of 10 minutes.

Therefore, it is concluded that the intermetallic compound between the Ni pad and the $(Cu_{1-x}Ni_x)_6Sn_5$ compound is the $(Ni_{1-y}Cu_y)_3Sn_4$ compound.

Figure 14:
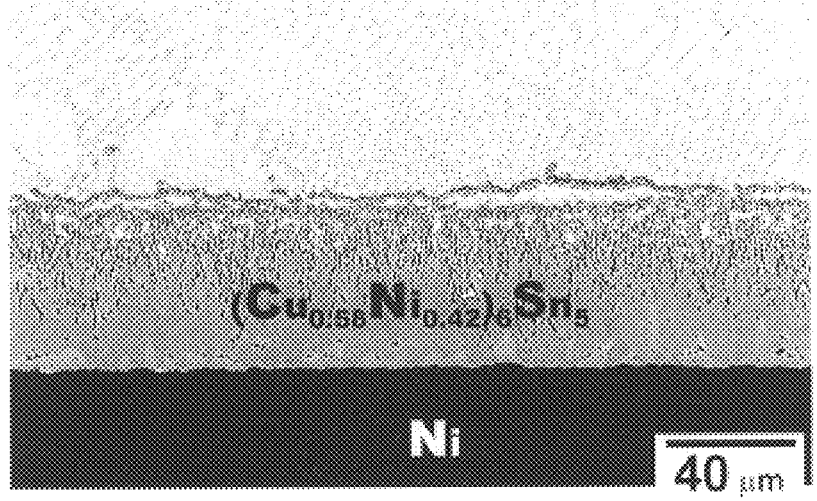
Figure 14:
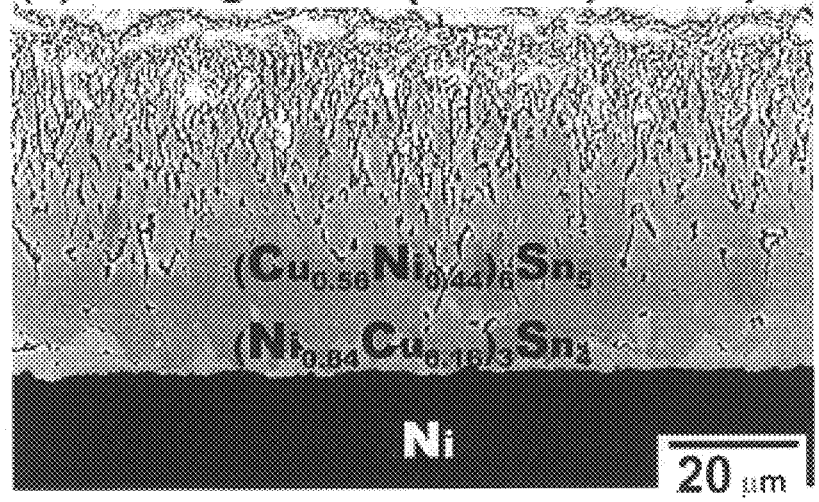

As shown in FIG. 14, the thickness of the $(Cu_{1-x}Ni_x)_6Sn_5$ compound increases as the reaction (soldering) time increases. Therefore, the $(Cu_{1-x}Ni_x)_6Sn_5$ compound is formed from soldering reaction at the interface.

In conclusion, as long as the copper concentration of the solder is limited between 0.4 wt. % to 0.6 wt. %, there is a $(Ni_{1-y}Cu_y)_3Sn_4$ layer formed between the Ni pad and the continuous $(Cu_{1-x}Ni_x)_6Sn_5$ layer. That is, if the SnAgCu solder containing 0.5 wt. % copper concentration is used, there are two continuous intermetallic layers of the $(Cu_{1-x}Ni_x)_6Sn_5$ compound and the $(Ni_{1-y}Cu_y)_3Sn_4$ compound formed at the interface. While the copper concentration of the solder is limited between 0.4 wt. % to 0.6 wt. %, the mass of the $(Ni_{1-y}Cu_y)_3Sn_4$ intermetallic layer decreases and that of the $(Cu_{1-x}Ni_x)_6Sn_5$ intermetallic layer increases.

The compositions of the intermetallic compounds at the interface after soldering the SnAgCu solder series in Table 1 with the Ni pad are listed in Table 3.

control the types of the intermetallic compounds, but also growth rates of the soldering intermetallic compounds.

3. The method of the present invention for controlling the formation of the intermetallic compounds is greatly influenced by the copper concentration in the solder paste. Particularly, if the copper concentration is between 0.4 wt. % to 0.6 wt. %, the states of the intermetallic compounds vary significantly due to minor processing errors in Cu concentration. Therefore, the present invention provides a method for controlling the formation of desirable intermetallic compounds at the interface.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

| No. | Solder | Phase States | | Relative Location | Distribution | Average values of x'y |
|---|---|---|---|---|---|---|
| 1 | Sn 3.5 Ag | 1 | $(Ni_{1-y}Cu_y)_3Sn_4$ | — | Continuous | y = 0 |
| 2 | Sn 3.9 Ag 0.2 Cu | 2 | $(Cu_{1-x}Ni_x)_6Sn_5$ | Near solder | Non-continuous | x = 0.40 |
|   |   |   | $(Ni_{1-y}Cu_y)_3Sn_4$ | Near Ni pad | Continuous | y = 0.14 |
| 3 | Sn 3.9 Ag 0.4 Cu | 2 | $(Cu_{1-x}Ni_x)_6Sn_5$ | Near solder | Non-continuous | x = 0.42 |
|   |   |   | $(Ni_{1-y}Ni_y)_3Sn_4$ | Near Ni pad | Continuous | y = 0.17 |
| 4 | Sn 3.9 Ag 0.5 Cu | 2 | $(Cu_{1-x}Ni_x)_6Sn_5$ | Near solder | Continuous | x = 0.42 |
|   |   |   | $(Ni_{1-y}Cu_y)_3Sn_4$ | Near Ni pad | Continuous | y = 0.16 |
| 5 | Sn 4.0 Ag 0.5 Cu | 2 | $(Cu_{1-x}Ni_x)_6Sn_5$ | Near solder | Continuous | x = 0.42 |
|   |   |   | $(Ni_{1-y}Cu_y)_3Sn_4$ | Near Ni pad | Continuous | y = 0.16 |
| 6 | Sn 3.9 Ag 0.6 Cu | 1 | $(Cu_{1-x}Ni_x)_6Sn_5$ | — | Continuous | x = 0.40 |
| 7 | Sn 3.9 Ag 0.7 Cu | 1 | $(Cu_{1-x}Ni_x)_6Sn_5$ | — | Continuous | x = 0.37 |
| 8 | Sn 3.9 Ag 0.8 Cu | 1 | $(Cu_{1-x}Ni_x)_6Sn_5$ | — | Continuous | x = 0.34 |
| 9 | Sn 3.5 Ag 1.0 Cu | 1 | $(Cu_{1-x}Ni_x)_6Sn_5$ | — | Continuous | x = 0.20 |
| 10 | Sn 3.9 Ag 1.0 Cu | 1 | $(Cu_{1-x}Ni_x)_6Sn_5$ | — | Continuous | x = 0.20 |
| 11 | Sn 3.9 Ag 3.0 Cu | 1 | $(Cu_{1-x}Ni_x)_6Sn_5$ | Near solder | Non-continuous | x1 = 0.09 |
|   |   |   | $(Cu_{1-x2}Ni_{x2})_6Sn_5$ | Near Ni pad | Continuous | x2 = 0.17 |

If the copper concentration in SnAgCu solders is between 0.6 wt. % to 3.0 wt. % (including 0.6 wt. %), the type of the soldering interlayer formed at the interface is $(Cu_{1-x}Ni_x)_6Sn_5$. If the copper concentration in SnAgCu solders is between 0 wt. % to 0.4 wt. % (including 0.4 wt. %), the type of the soldering interlayer is $(Ni_{1-y}Cu_y)_3Sn_4$. If the copper concentration in SnAgCu solder is between 0.4 wt. % to 0.6 wt. %, the soldering interlayer is a composite layer including the $(Cu_{1-x}Ni_x)_6Sn5$ layer and the $(Ni_{1-y}Cu_y)_3Sn_4$ layer.

If there are some $(Ni_{1-y}Cu_y)_3Sn_4$ compounds present at the interface, the neighboring $(Cu_{1-x}Ni_x)_6Sn_5$ compounds have x values approaching 0.42. The $(Ni_{1-y}Cu_y)_3Sn_4$ compounds neighboring the $(Cu_{0.58}Ni_{0.42})_6Sn_5$ compound have y values approaching 0.17. Since no intermetallic compounds exist between $(Cu_{0.58}Ni_{0.42})_6Sn_5$ and $(Ni_{0.83}Cu_{0.17})_3Sn_4$, it implies that there is a tie-line between $(Cu_{0.58}Ni_{0.42})_6Sn_5$ and $(Ni_{0.83}Cu_{0.17})_3Sn_4$.

In conclusion, the present invention has the following advantages:

1. The method of the present invention can control the types of the intermetallic compounds by adjusting the minor copper concentration in the SnAgCu solders.
2. The method of the present invention for controlling the formation of the intermetallic compounds can not only

What is claimed is:

1. A method for controlling the formation of intermetallic compounds in solder joints, comprising:
   providing a substrate having a nickel-bearing pad;
   forming a SnAgCu solder on the nickel-bearing pad; and
   performing a reflow process to the SnAgCu solder and the nickel-bearing pad, so that the SnAgCu solder reacts with the nickel-bearing pad to form a soldering intermetallic compound, wherein if the SnAgCu solder has a copper concentration between 0.6 wt. % to 3.0 wt. % (including 0.6 wt. %), the soldering intermetallic compound includes a continuous $(Cu_{1-x}Ni_x)_6Sn_5$ layer, wherein if the copper concentration of the SnAgCu solder is between 0 wt. % to 0.4 wt. % (including 0.4 wt. %), the soldering intermetallic compound includes a continuos $(Ni_{1-y}Cu_y)_3Sn_4$ layer and a non-continuous $(Cu_{1-x}Ni_x)_6Sn_5$ layer, and wherein if the copper concentration of the SnAgCu solder is between 0.4 wt. % to 0.6 wt. %, the soldering intermetallic compound includes the continuous $(Cu_{1-x}Ni_x)_6Sn_5$ layer and the continuous $(Ni_{1-y}Cu_y)_3Sn_4$ layer.

2. The method of claim 1, wherein the SnAgCu solder has a composition of 93.1–96.5 wt. % tin, 3.5–4 wt. % silver and 0–3 wt. % copper.

3. The method of claim 1, wherein if the copper concentration of the SnAgCu solder is 0 wt. %, the soldering intermetallic compound includes a continuous $Ni_3Sn_4$ layer.

4. The method of claim 3, wherein if the copper concentration of the SnAgCu solder is 0 wt. %, the SnAgCu solder has a composition of 96.5 wt. % tin and 3.5 wt. % silver.

5. The method of claim 1, wherein if the copper concentration of the SnAgCu solder is 0.2 wt. %, the soldering intermetallic compound includes a continuos $(Ni_{0.86}Cu_{0.14})_3Sn_4$ layer and $(Ni_{0.60}Cu_{0.40})_6Sn_5$ formed in a non-continuous form on the $(Ni_{0.86}Cu_{0.14})_3Sn_4$ layer.

6. The method of claim 5, wherein if the copper concentration of the SnAgCu solder is 0.2 wt. %, the SnAgCu solder has a composition of 95.9 wt. % tin and 3.9 wt. % silver.

7. The method of claim 1, wherein if the copper concentration of the SnAgCu solder is 0.4 wt. %, the soldering intermetallic compound includes a continuos $(Ni_{0.83}Cu_{0.17})_3Sn_4$ layer and $(Cu_{0.58}Ni_{0.42})_6Sn_5$ formed in a non-continuous form on the $(Ni_{0.83}Cu_{0.17})_3Sn_4$ layer.

8. The method of claim 7, wherein if the copper concentration of the SnAgCu solder is 0.4 wt. %, the SnAgCu solder has a composition of 95.7 wt. % tin and 3.9 wt. % silver.

9. The method of claim 1, wherein if the copper concentration of the SnAgCu solder is 0.5 wt. %, the soldering intermetallic compound includes a continuous $(Cu_{0.58}Ni_{0.42})_6Sn_5$ layer and a continuous $(Ni_{0.84}Cu_{0.16})_3Sn_4$ layer.

10. The method of claim 9, wherein if the copper concentration of the SnAgCu solder is 0.5 wt. %, the SnAgCu solder has a composition of 95.6 wt. % tin and 3.9 wt. % silver.

11. The method of claim 9, wherein if the copper concentration of the SnAgCu solder is 0.5 wt. %, the SnAgCu solder has a composition of 95.5. wt. % tin and 4 wt. % silver.

12. The method of claim 1, wherein if the copper concentration of the SnAgCu solder is 0.6 wt. %, the soldering intermetallic compound includes a continuous $(Cu_{0.60}Ni_{0.40})_6Sn_5$ layer.

13. The method of claim 12, wherein if the copper concentration of the SnAgCu solder is 0.6 wt. %, the SnAgCu solder has a composition of 95.5 wt. % tin and 3.9 wt. % silver.

14. The method of claim 1, wherein if the copper concentration of the SnAgCu solder is 0.7 wt. %, the soldering intermetallic compound includes a continuous $(Cu_{0.63}Ni_{0.37})_6Sn_5$ layer.

15. The method of claim 14, wherein if the copper concentration of the SnAgCu solder is 0.7 wt. %, the SnAgCu solder has a composition of 95.4 wt. % tin and 3.9 wt. % silver.

16. The method of claim 1, wherein if the copper concentration of the SnAgCu solder is 0.8 wt. %, the soldering intermetallic compound includes a continuous $(Cu_{0.66}Ni_{0.34})_6Sn_5$ layer.

17. The method of claim 16, wherein if the copper concentration of the SnAgCu solder is 0.8 wt. %, the SnAgCu solder has a composition of 95.3 wt. % tin and 3.9 wt. % silver.

18. The method of claim 1, wherein if the copper concentration of the SnAgCu solder is 1.0 wt. %, the soldering intermetallic compound includes a continuous $(Cu_{0.80}Ni_{0.20})_6Sn_5$ layer.

19. The method of claim 18, wherein if the copper concentration of the SnAgCu solder is 1.0 wt. %, the SnAgCu solder has a composition of 95.5 wt. % tin and 3.5 wt. % silver.

20. The method of claim 18, wherein if the copper concentration of the SnAgCu solder is 1.0 wt. %, the SnAgCu solder has a composition of 95.1 wt. % tin and 3.9 wt. % silver.

21. The method of claim 1, wherein if the copper concentration of the SnAgCu solder is 3 wt. %, the soldering intermetallic compound includes a continuous $(Cu_{0.83}Ni_{0.17})_6Sn_5$ layer and $(Ni_{0.91}Cu_{0.09})_6Sn_5$ formed in a non-continuous form on the continuous $(Cu_{0.83}Ni_{0.17})_6Sn_5$ layer.

22. The method of claim 21, wherein if the copper concentration of the SnAgCu solder is 3 wt. %, the SnAgCu solder has a composition of 93.1 wt. % tin and 3.9 wt. % silver.

23. The method of claim 1, wherein the nickel-bearing pad is a Ni pad, a Au/Ni double-layered pad or a Pd/Ni double-layered pad.

24. A method for controlling types of soldering intermetallic compounds by adjusting a copper concentration of a SnAgCu solder, wherein a nickel-bearing pad is soldered with the SnAgCu solder to form the soldering intermetallic compound, wherein if the SnAgCu solder has a copper concentration higher or equivalent to 0.6 wt. %, the soldering intermetallic compound includes a continuous $(Cu_{1-x}Ni_x)_6Sn_5$ layer, wherein if the copper concentration of the SnAgCu solder is lower than or equivalent to 0.4 wt. %, the soldering intermetallic compound includes a continues $(Ni_{1-y}Cu_y)_3Sn_4$ layer and a non-continuous $(Cu_{1-x}Ni_x)_6Sn_5$ layer, and wherein if the copper concentration of the SnAgCu solder is between 0.4 wt. % to 0.6 wt. %, the soldering intermetallic compound includes the continuous $(Cu_{1-x}Ni_x)_6Sn_5$ layer and the continuous $(Ni_{1-y}Cu_y)_3Sn_4$ layer.

25. The method of claim 24, wherein the SnAgCu solder has a composition of 93.1–96.5 wt. % tin, 3.5–4 wt. % silver and 0–3 wt. % copper.

26. The method of claim 24, wherein if the copper concentration of the SnAgCu solder is 0 wt. %, the soldering intermetallic compound includes a continuous $Ni_3Sn_4$ layer.

27. The method of claim 26, wherein if the copper concentration of the SnAgCu solder is 0 wt. %, the SnAgCu solder has a composition of 96.5 wt. % tin and 3.5 wt. % silver.

28. The method of claim 24, wherein if the copper concentration of the SnAgCu solder is 0.2 wt. %, the soldering intermetallic compound includes a continuos $(Ni_{0.86}Cu_{0.14})_3Sn_4$ layer and $(Ni_{0.60}Cu_{0.40})_6Sn_5$ formed in a non-continuous form on the $(Ni_{0.86}Cu_{0.14})_3Sn_4$ layer.

29. The method of claim 28, wherein if the copper concentration of the SnAgCu solder is 0.2 wt. %, the SnAgCu solder has a composition of 95.9 wt. % tin and 3.9 wt. % silver.

30. The method of claim 24, wherein if the copper concentration of the SnAgCu solder is 0.4 wt. %, the soldering intermetallic compound includes a continuos $(Ni_{0.83}Cu_{0.17})_3Sn_4$ layer and $(Cu_{0.58}Ni_{0.42})_6Sn_5$ formed in a non-continuous form on the $(Ni_{0.83}Cu_{0.17})_3Sn_4$ layer.

31. The method of claim 30, wherein if the copper concentration of the SnAgCu solder is 0.4 wt. %, the SnAgCu solder has a composition of 95.7 wt. % tin and 3.9 wt. % silver.

32. The method of claim 24, wherein if the copper concentration of the SnAgCu solder is 0.5 wt. %, the soldering intermetallic compound includes a continuous $(Cu_{0.58}Ni_{0.42})_6Sn_5$ layer and a continuous $(Ni_{0.84}Cu_{0.16})_3Sn_4$ layer.

33. The method of claim 32, wherein if the copper concentration of the SnAgCu solder is 0.5 wt. %, the SnAgCu solder has a composition of 95.6 wt. % tin and 3.9 wt. % silver.

34. The method of claim 32, wherein if the copper concentration of the SnAgCu solder is 0.5 wt. %, the SnAgCu solder has a composition of 95.5 wt. % tin and 4 wt. % silver.

35. The method of claim 24, wherein if the copper concentration of the SnAgCu solder is 0.6 wt. %, the soldering intermetallic compound includes a continuous $(Cu_{0.60}Ni_{0.40})_6Sn_5$ layer.

36. The method of claim 35, wherein if the copper concentration of the SnAgCu solder is 0.6 wt. %, the SnAgCu solder has a composition of 95.5 wt. % tin and 3.9 wt. % silver.

37. The method of claim 24, wherein if the copper concentration of the SnAgCu solder is 0.7 wt. %, the soldering intermetallic compound includes a continuous $(Cu_{0.63}Ni_{0.37})_6Sn_5$ layer.

38. The method of claim 37, wherein if the copper concentration of the SnAgCu solder is 0.7 wt. %, the SnAgCu solder has a composition of 95.4 wt. % tin and 3.9 wt. % silver.

39. The method of claim 24, wherein if the copper concentration of the SnAgCu solder is 0.8 wt. %, the soldering intermetallic compound includes a continuous $(Cu_{0.66}Ni_{0.34})_6Sn_5$ layer.

40. The method of claim 39, wherein if the copper concentration of the SnAgCu solder is 0.8 wt. %, the SnAgCu solder has a composition of 95.3 wt. % tin and 3.9 wt. % silver.

41. The method of claim 24, wherein if the copper concentration of the SnAgCu solder is 1.0 wt. %, the soldering intermetallic compound includes a continuous $(Cu_{0.80}Ni_{0.20})_6Sn_5$ layer.

42. The method of claim 41, wherein if the copper concentration of the SnAgCu solder is 1.0 wt. %, the SnAgCu solder has a composition of 95.5 wt. % tin and 3.5 wt. % silver.

43. The method of claim 41, wherein if the copper concentration of the SnAgCu solder is 1.0 wt. %, the SnAgCu solder has a composition of 95.1 wt. % tin and 3.9 wt. % silver.

44. The method of claim 24, wherein if the copper concentration of the SnAgCu solder is 3 wt. %, the soldering intermetallic compound includes a continuous $(Cu_{0.83}Ni_{0.17})_6Sn_5$ layer and $(Ni_{0.91}Cu_{0.09})_6Sn_5$ formed in a non-continuous form on the continuous $(Cu_{0.83}Ni_{0.17})_6Sn_5$ layer.

45. The method of claim 41, wherein if the copper concentration of the SnAgCu solder is 3 wt. %, the SnAgCu solder has a composition of 93.1 wt. % tin and 3.9 wt. % silver.

* * * * *